(12) United States Patent
Kato

(10) Patent No.: US 6,885,183 B2
(45) Date of Patent: Apr. 26, 2005

(54) CURRENT PROBE

(75) Inventor: Katsuhisa Kato, Saitama (JP)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 10/786,485

(22) Filed: Feb. 25, 2004

(65) Prior Publication Data

US 2004/0201373 A1 Oct. 14, 2004

(51) Int. Cl.$^7$ .............................................. G01R 33/00
(52) U.S. Cl. ............................................... 324/117 R
(58) Field of Search ...................... 324/127 R, 127 H, 324/765, 158.1, 127, 126; 323/246, 257, 258

(56) References Cited

U.S. PATENT DOCUMENTS

| | | | | |
|---|---|---|---|---|
| 4,912,396 A | * | 3/1990 | Groenenboom | 324/117 R |
| 5,015,945 A | * | 5/1991 | Radun | 324/127 |
| 6,366,076 B1 | * | 4/2002 | Karrer et al. | 324/117 R |
| 6,563,296 B2 | * | 5/2003 | Cooke | 324/127 |
| 6,680,608 B2 | * | 1/2004 | Kojovic | 324/127 |

FOREIGN PATENT DOCUMENTS

JP          09-023085          1/1997

* cited by examiner

Primary Examiner—David Zarneke
Assistant Examiner—Tung X. Nguyen
(74) Attorney, Agent, or Firm—William K. Bucher

(57) ABSTRACT

A current probe suitable for detecting a large current from DC to high frequency has first and second current detecting means. The first current detecting means detects a current under test from DC to a predetermined intermediate frequency band. It has an orthogonal flux gate element, an induced voltage detecting circuit 46 for detecting an induced voltage of the orthogonal fluxgate element, and a feedback coil 50 receiving the output voltage of the induced voltage detecting circuit 46 for generating magnetic flux to cancel the magnetic flux generated by the current under test. The second current detecting means has a Rogowski coil 12 and an integration circuit and detects said current under test higher than the predetermined intermediate frequency band.

5 Claims, 5 Drawing Sheets

CURRENT PROBE

BACKGROUND OF THE INVENTION

The present invention relates generally to current probes and more particularly to a current probe suitable for detecting wide bandwidth large currents from DC to high frequencies using an orthogonal fluxgate magnetic sensor and a Rogowski coil.

A current probe is used to detect a current signal flowing in a line under test, such as a cable. A current probe using a transformer is suitable for detecting a relatively weak current in the micro or milliamp range. However, for high currents in the kilo or mega-amps, a current detecting circuit using a Rogowski coil would be suitable. The Rogowski coil does not require the use of a magnetic core and thus the size is smaller than a corresponding transformer rated for such currents.

FIG. 1 shows a schematic block diagram of a current detecting circuit using the Rogowski coil. The Rogowski coil 12 has a detecting coil 11 and a conducting return wire 9 formed from a single piece of wire 13. The wire is formed in loops to produce the detecting coil 11. The return wire 9 has one end 9b connected to the end loop of the detecting coil 11 at 12b and is folded back through the center of the detecting coil 11 to the beginning loop 12a of the detecting coil 11. The beginning loop 12a of the detecting coil 11 and the free end 9a of the return wire 9 are closely spaced together. In addition, the ends 12a and 12b of the detecting coil 11 are also arranged to be physically close together so that the detecting coil 11 constitute a magnetic closed loop around a line under test 10. The beginning loop 12a of the detecting coil 11 is coupled to the integration circuit that has a resister 14, capacitor 16 and an operational amplifier 18. The free end 9a of the conducting return wire 9 is coupled to electrical ground.

A current Ip flowing in the line under test 10 generates magnetic flux that induces a voltage in the Rogowski coil 12. The integration circuit maintains a flat frequency characteristic by lowering the gain of the circuit as the frequency of the current Ip increases, which increases the induced voltage in the Rogowski coil 12.

Another reason why the Rogowski coil is suitable for detecting large currents is its flexibility. Large currents are sometime carried by a thick metal bus bar. If the metal bus bar is intricately wired, a desired line under test of the bus bar may not be in a position for putting it through a detecting portion of the current probe. A flexible Rogowski coil can make a loop around the line under test by passing it between wires. A drawback to the Rogowski coil, however, is that it cannot measure DC current and has low sensitivity at low frequency.

A magnetic sensor may be used to measure a current value from DC to low frequencies. A Hall element, magneto-resistive (MR) element, giant magneto-resistive (GMR) element, fluxgate element and the like are known as the magnetic sensors. They provide a voltage according to a magnetic field so that it makes it possible to detect a current from DC to low frequencies by detecting the voltage.

The fluxgate element has parallel and orthogonal types. U.S. Pat. No. 6,380,735 (Kawakami) discloses a magnetic sensor of an orthogonal fluxgate element. FIG. 2 shows a schematic diagram of the orthogonal fluxgate element. A conductive bar 21 is placed coaxially through a cylindrical magnetic core 22. The conductive bar 21 is coupled to a high-frequency power source 25 that provides a high frequency signal. A detecting coil 23 is placed around the magnetic core 22 for detecting the magnetic flux of a magnetic field under test. FIG. 3 illustrates the magnetic flux distribution formed by an exciting current $I_{EX}$ flowing through the conductive bar 21. If the longitudinal directions of the conductive bar 21 and the core 22 are aligned in parallel with the magnetic field under test, the magnetic field under test is attracted toward the core 22 so that the magnetic flux is formed through the core 22 as shown in FIG. 4a.

When a driving current $I_{EX}$ of a sine wave as shown in FIG. 5(1) is provided to the conductive bar 21, the circumferential surface of the core 22 is magnetized as indicated by arrows as shown in FIGS. 4b or 4d. If the driving current is increasing from the value shown in FIG. 5(1a) to the maximum value shown in FIG. 5(1b), the magnetization the core 22 reaches a saturated state so that the magnetic flux of the magnetic field under test leaves the core 22 and is aligned parallel with the conductive bar 21. During this period, the degree of the magnetization of the core 22 in the longitudinal direction is decreasing as shown in FIG. 5(2). The output voltage of the detecting coil 23 is larger at the position where the changing rate of the magnetization of the core 22 in the longitudinal direction is faster.

As the driving current $I_{EX}$ is decreasing to the zero-crossing point shown in FIG. 5(1c) from the maximum value shown in FIG. 5(1b), the magnetic flux of the magnetic field under test again passing through the core 22 as shown in FIG. 5(2b to 2c). When the direction of the driving current $I_{EX}$ is reversed, the circumferential face of the core 22 is magnetized in a reverse direction. When the driving current reached the maximum reversed value, the magnetization of the core 22 again reaches a saturated state and the magnetic flux of the magnetic filed under test again leaves the core 22 and is aligned parallel with the longitudinal direction of the core 22 as shown in FIG. 4d. As described, the direction and the density of the magnetic flux changes according to the change of the driving current, which induces the voltage of the detecting coil 23, wherein the voltage of the detecting coil 23 has 2 cycles of the driving current.

As described, the flexibility of the Rogowski coil is suitable for measuring a large current, but has low sensitivity for a current of DC or low frequency. Therefore, what is desired is to provide a flexible current probe suitable for seamlessly detecting large currents from DC to high frequency.

SUMMARY OF THE INVENTION

A current probe according to the present invention is suitable for detecting a large currents under test. The current probe has two main portions, first and second current detecting means. The first current detecting means detects the value of the current under test from DC to a predetermined intermediate frequency span. It has an orthogonal fluxgate element, an induced voltage detecting means for detecting the induced voltage of the orthogonal fluxgate element, and a feedback coil receiving the output voltage of the induced voltage detecting means. The feedback coil generates a magnetic flux to cancel the magnetic flux generated in the induced voltage detecting means by the current under test to prevent the induced voltage detecting means from magnetically saturating. This keeps the linearity between the value of the current under test and the detected value of the first current detecting means. The second current detecting means detects the value of the higher frequencies above the predetermined intermediate frequency band. It has a Rogowski coil and an integration circuit.

The first current detecting means may further have a shield means for magnetically shielding the orthogonal fluxgate element from external magnetic field. The feedback coil may wind around the shield means which serves as a magnetic core so that the feedback coil more effectively generates the magnetic flux to cancel the magnetic flux generated in the induced voltage detecting means by the current under test.

The orthogonal fluxgate element has a magnetic wire to which the driving current is provided. The magnetic wire is flexible and makes up a loop with a seam. Because of the flexibility, the current probe of the present invention can make up a loop around the signal line under test even if the signal line under test cannot be drawn out to a convenient position.

The magnetic shield means may be flexible and make up a magnetic loop with a seam. Weaving fine strings of magnetic metal may make the magnetic shield. Similarly, the Rogowski coil may be flexible and make up a magnetic loop with a seam.

The objects, advantages and other novel features of the present invention are apparent from the following detailed description when read in conjunction with the appended claims and attached drawings.

DETAILED DESCRIPTION OF PREFERRED EMBODIMENTS THE INVENTION

A current probe according to the present invention has first and second current detecting means. The first current detecting means mainly detects a current under test in a low frequency band (a first frequency band) from DC to a predetermined intermediate frequency band. The second current detecting means mainly detects the current under test in a frequency band (a second frequency band) that is higher than the predetermined intermediate frequency band. The main component of the first current detecting means is an orthogonal fluxgate element. The main component of the second current detecting means is a Rogowski coil. The predetermined intermediate frequency band is a boundary band covering the end of the first frequency band and the start of the second frequency band measured by the first and second current detecting means. The predetermined intermediate frequency band is determined as a function of the frequency characteristics of the first and second current detecting means.

Figure 5:
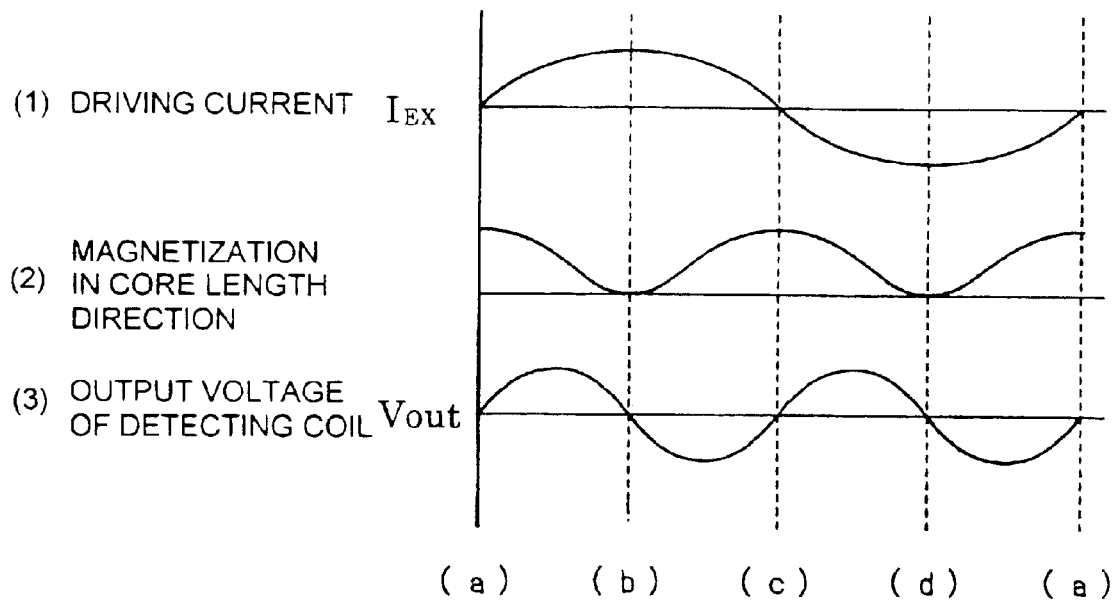
FIG. 5 shows waveforms of driving current, magnetization in core length direction and output voltage of detecting coil when the driving current flows in an orthogonal fluxgate element.
Figure 6:
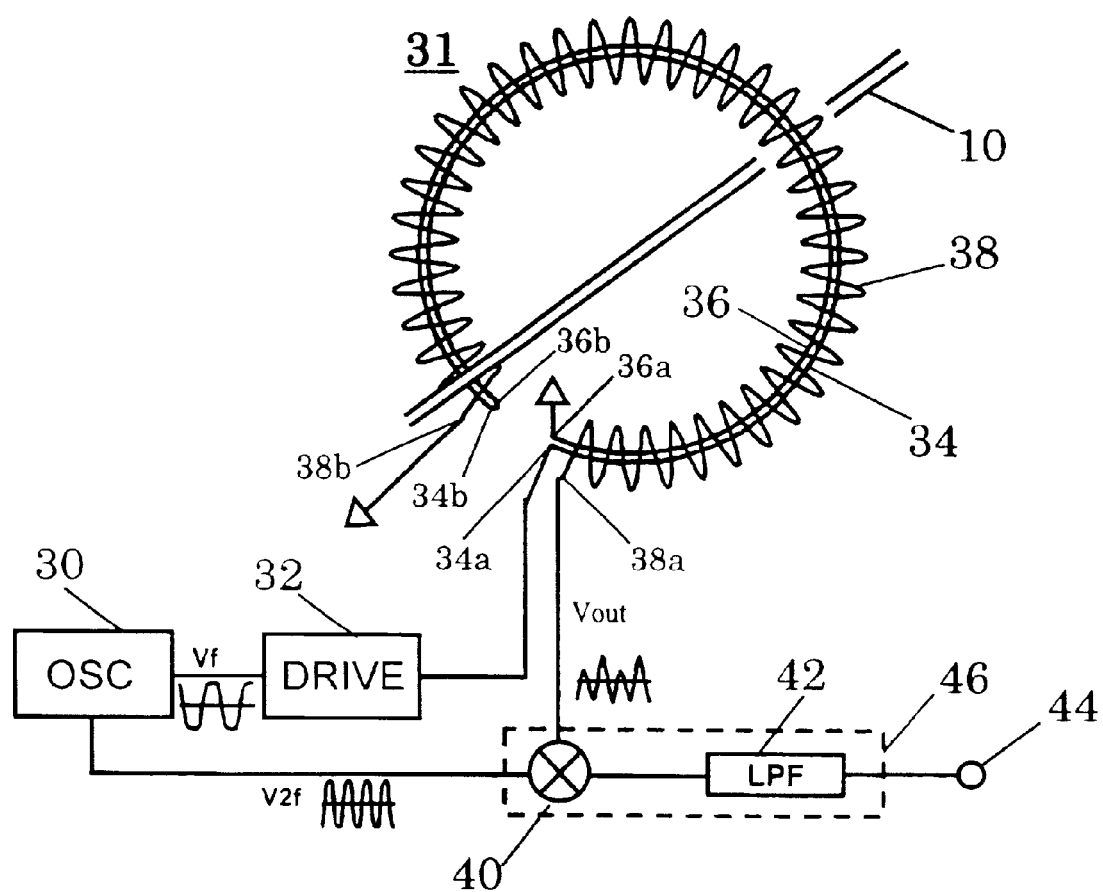
FIG. 6 shows a schematic diagram of an orthogonal fluxgate element as a main component of a first current detecting means and the peripheral circuit.

FIG. 6 shows a schematic diagram of the orthogonal fluxgate element as the main component of the first current detecting means with associated drive and detection circuits. An oscillator 30 provides a signal Vf of a frequency f, which is amplified by a driving circuit 32 and provided to one end 34a of a magnetic wire 34 as a driving current as shown in FIG. 5(1). The magnetic wire 34 is preferably formed of an amorphous flexible magnetic material having a relatively high permeability. A difference between the conventional orthogonal fluxgate element disclosed in the above U.S. Pat. No. 6,380,735 (Kawakami) is that the magnetic wire 34 itself has a high relative permeability so that it attracts the magnetic flux generated by the current in the line under test when there is no driving current, and does not attract the magnetic flux when there is the driving current. Therefore, the repeat of this process changes the density of the magnetic flux induced by the current in the line under test. The other end 34b of the magnetic wire 34 is connected to one end 36b of a conductive return wire 36. The conductive return wire 36 is positioned substantially parallel and close to the magnetic wire 34. The other end 36a of the conductive return wire 36 is coupled to electrical ground.

A detecting coil 38 winds around the magnetic wire and the conductive return wire 36. One end 38a of the detecting coil 38 is coupled to the detection circuitry 46 and the other end 38b is coupled to electrical ground. The detecting coil 38 provides an induced voltage output Vout of the frequency $2f$ which is as twice as that of the signal Vf provided by the driving circuit 32, as described above. A mixer 40 multiplies the signal Vout with a signal V2f of a frequency $2f$ for synchronized detection. A low pass filter 42 filters the output of the mixer 40 to provides a voltage proportional to the current flowing in the signal line under test 10 to an output terminal 44.

Figure 7:
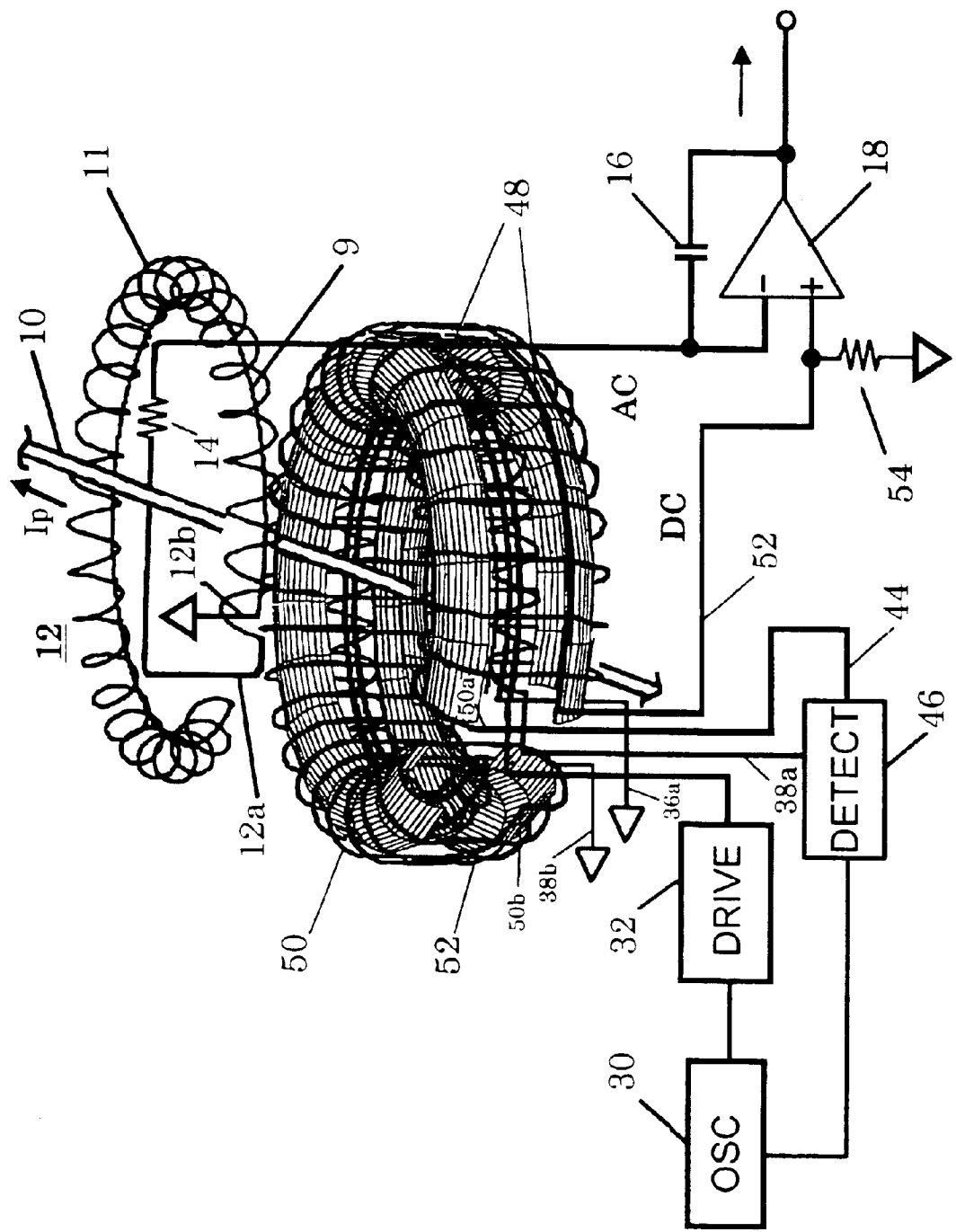
FIG. 7 shows a schematic diagram of an embodiment of a current probe according to the present invention.

FIG. 7 shows a schematic diagram of an embodiment of the present invention. Compared with FIG. 6, there is a magnetic shield 48 around the detecting coil 38 of the first current detecting means. The magnetic shield 48 makes up a magnetic loop so as to wrap the fluxgate element. A feedback coil 50 winds around the magnetic shield 48. In FIG. 7, the magnetic shield 48 is illustrated with upper and lower portions for a better view of the fluxgate element inside for convenience of explanation. The actual embodiment is designed to completely wrap the magnetic wire 34, the conductive return wire 36 and the detecting coil 38. The magnetic shield 48 has two functions. The first is to prevent an external magnetic field, such as terrestrial magnetism, from affecting the detecting coil 38. The second is to serve as a magnetic core for the feedback coil 50 for generating a magnetic flux to produce a negative feedback as described below. The magnetic shield may be made by weaving fine metal strings having high relative permeability. The fine metal strings may be manufactured by a cold drawing process, such as described in Japanese patent publication H09-023085.

The detecting circuit 46 provides the voltage from the output terminal 44 to one end 50a of the feedback coil 50. The feedback coil 50 starts from the end 50a and winds around the loop of the magnetic shield 48. The other end 50b of the feedback coil 50 is connected to the conductive return wire 52 which returns back toward the end 50a along the curve of the magnetic shield 48. The conductive return wire 52 is drawn out from near the end 50a of the feedback coil 50 and coupled to a resister 54. The resister 54 converts the current flowing in the return wire 52 into a voltage that is provided to an operational amplifier 18. The voltage appearing across the resister 54 is proportional to the value of the current under test in the first frequency band from DC to the predetermined frequency band flowing in the signal line under test 10.

Note that the feedback coil 50 is wired such that the current flowing in the feedback coil 50 provides negative feedback to cancel the magnetic flux generated by the current in the signal line under test 10. The negative feedback prevents magnetic saturation, which maintains the linear relationship between the current in the signal line under test 10 and the output voltage of the detecting circuit 46. U.S. Pat. No. 3,525,041 (Velsink) is an example of a magnetic negative feedback circuit for use in current probes.

Figure 1:
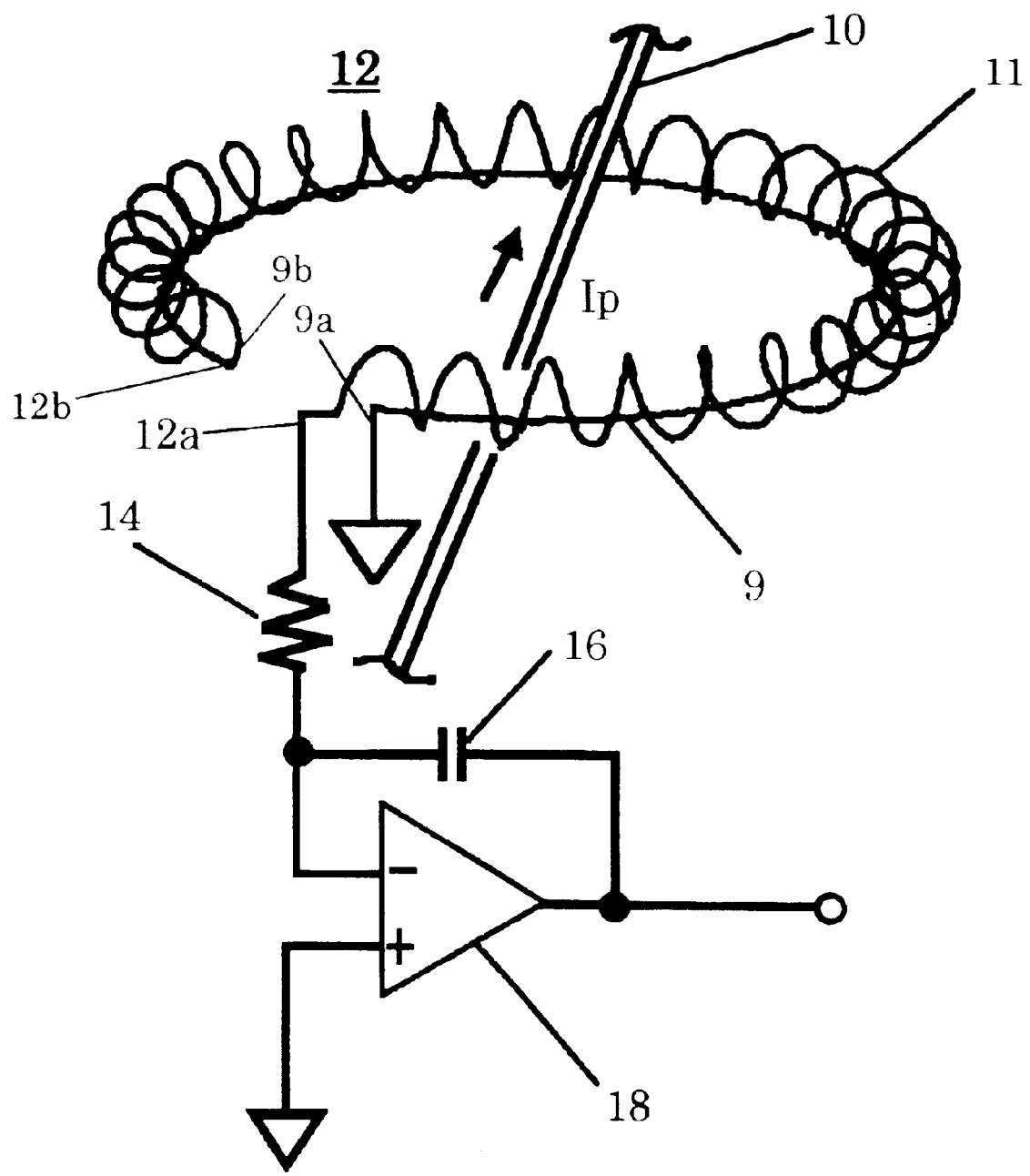
FIG. 1 shows a schematic block diagram of a current detecting circuit using a Rogowski coil.
Figure 2:
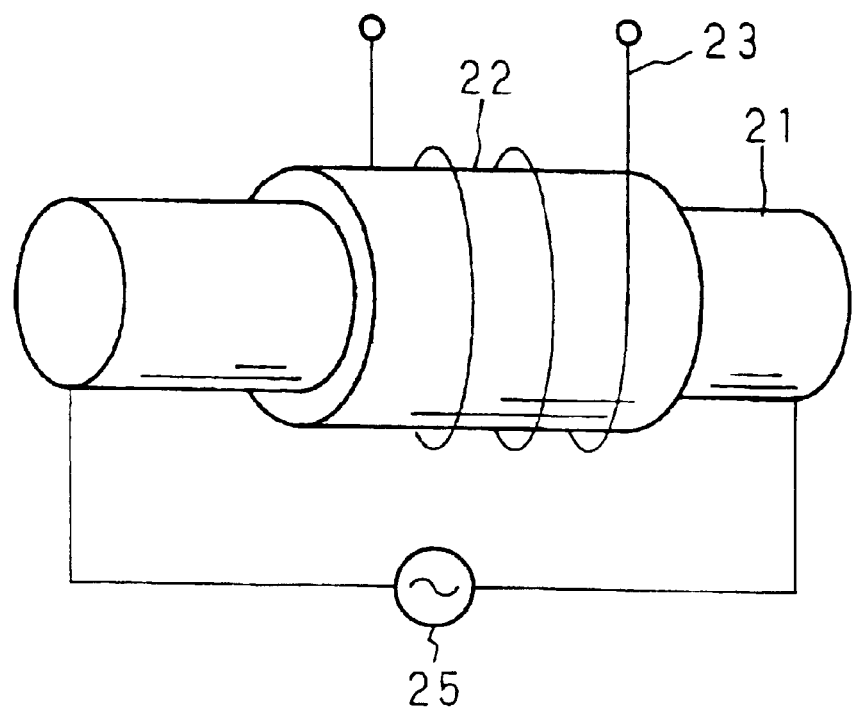
FIG. 2 shows a schematic diagram of an orthogonal fluxgate magnetic sensor.
Figure 3:
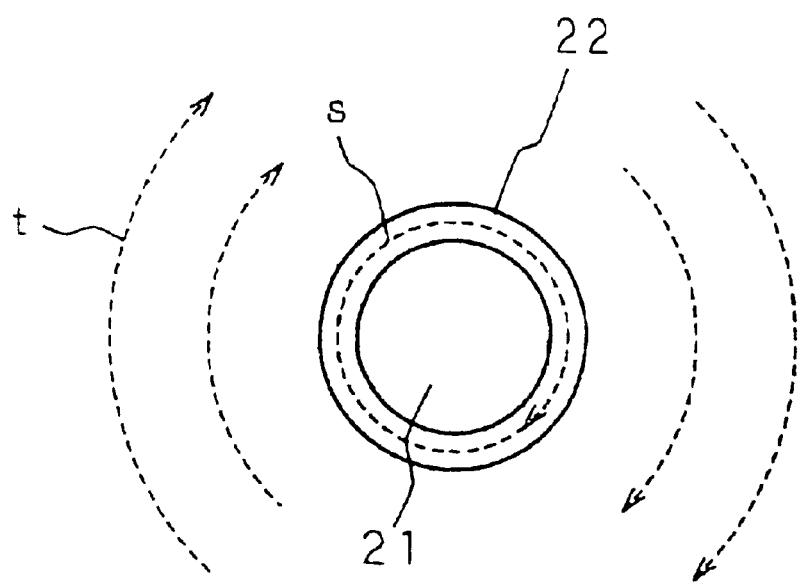
FIG. 3 shows the magnetic flux formed in the core of the orthogonal fluxgate magnetic sensor of FIG. 2.
Figure 4:
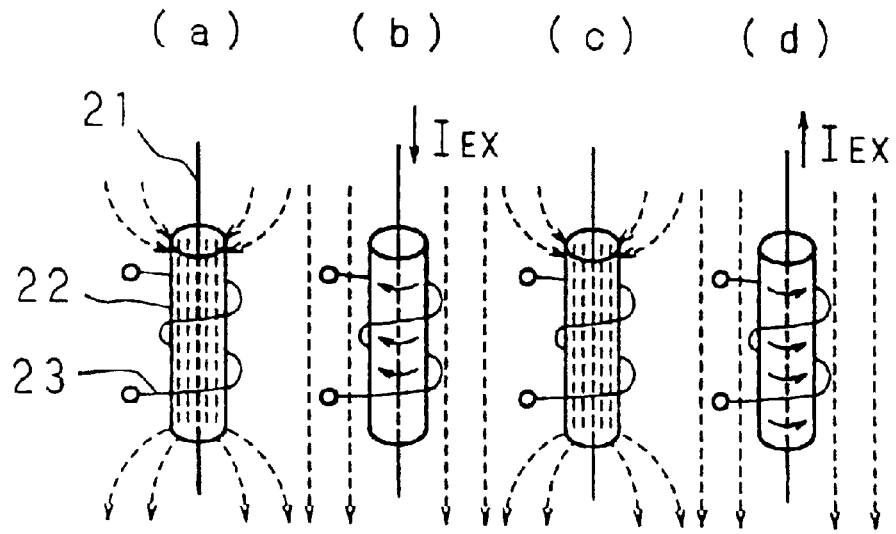
FIG. 4 shows an operation principle of an orthogonal fluxgate magnetic sensor.

The main component of the second current detecting means is a Rogowski coil 12 similar to the one shown in FIG. 1. Referring to FIG. 1, the Rogowski coil 12 has a detecting coil 11 and a conducting return wire 9 formed from a single piece of wire 13. The wire is formed in loops to produce the detecting coil 11. The return wire 9 has one end 9b connected to the end loop of the detecting coil 11 at 12b and is folded back through the center of the detecting coil 11 to the beginning loop 12a of the detecting coil 11. The beginning loop 12a of the detecting coil 11 and the free end 9a return wire are closely spaced together. In addition, the ends 12a and 12b of the detecting coil 11 are also arranged to be physically close together so that the detecting coil 11 constitute a magnetic closed loop around a line under test 10. The beginning loop 12a of the detecting coil 11 is coupled to the integration circuit that has a resister 14, capacitor 16 and an operational amplifier 18. The free end 9a of the conducting return wire 9 is coupled to electrical ground.

The operational amplifier 18 receives the low frequency band (first frequency band) component from DC to the predetermined intermediate frequency band of the current in the signal line under test 10 at the non-inverted input terminal. The inverted input terminal receives the high frequency (second frequency band) component higher than the predetermined intermediate frequency band of the current in the signal line under test 10. The operation amplifier 18 adds the two components, which enables the detection of the large current flowing in the signal line under test 10 from DC to high frequencies. The gains of the low (first) and high (second) frequency bands are adjusted to provide a flat frequency response over the predetermined intermediate frequency band.

The current probe of the present invention preferably includes coextensive seams in the orthogonal fluxgate element, the magnetic shield 48 and the Rogowski coil 12 to allow the current measurement elements to be placed around the signal line under test 10. The magnetic wire 34 of the orthogonal fluxgate element constitutes a magnetically closed loop system. If the ends 34a and 34b of the magnetic wire 34 are in proximate contact while the signal line under test 10 is inside the loop, it can constitute a magnetic closed loop even if the loop has a physical seam. Likewise, the magnetic shield 48 constitutes a magnetic closed loop as well as the Rogowski coil 12. The orthogonal fluxgate element, the magnetic shield 48 and the Rogowski coil 12 are opened at their respective seams and placed around the signal line under test 10. The seams are then closed to produce the magnetically closed loop systems for sensing the current in the signal line under test.

As described above, the current probe according to the present invention combines a high sensitivity fluxgate element and a Rogowski coil to achieve high sensitive measurements of a large currents from DC to high frequency flowing in a signal line under test. It can be made from flexible materials so that it can wind around a signal line under test by opening the loop from a seam and closing again even if the signal line under test may be a thick bus bar and cannot be drawn to a suitable position. That is, it can easily make up a magnetic closed loop around the signal line under test, which enables accurate measurement.

What is claimed is:

1. A current probe for detecting a value of a current flowing in a signal line under test, comprising:

a first current detecting means in the form of an orthogonal fluxgate element for detecting said current in the signal line under test from DC to a predetermined intermediate frequency band, an induced voltage detecting means for detecting an induced voltage of said orthogonal fluxgate element, and a feedback coil receiving the output voltage of said induced voltage detecting means for generating a magnetic flux for cancelling the magnetic flux generated in said induced voltage detecting means by said current in the signal line under test, and a second current detecting means having a Rogowski coil and an integration circuit for detecting said current in the signal line under test higher than said predetermined intermediate frequency band.

2. The current probe as recited in claim 1 wherein said first current detecting means further has a shield means for magnetically shielding said orthogonal fluxgate element from external magnetic fields, said feedback coil winding around said shield means which serves as a magnetic core so that said feedback coil effectively generates the magnetic flux.

3. The current probe as recited in claim 2 wherein said shield means is flexible and makes up a magnetic loop with a seam.

4. The current probe as recited in claim 1, 2 or 3 wherein said orthogonal fluxgate element has a magnetic wire to which a driving current is provided, and said magnetic wire is flexible and makes up a magnetic loop with a seam.

5. The current probe as recited in claim 1, 2, 3 or 4 wherein said Rogowski coil is flexible and makes up a magnetic loop with a seam.

* * * * *